United States Patent
Kohara et al.

(10) Patent No.: US 6,212,057 B1
(45) Date of Patent: Apr. 3, 2001

(54) FLEXIBLE THIN FILM CAPACITOR HAVING AN ADHESIVE FILM

(75) Inventors: Naoki Kohara; Taisuke Sawada; Masatoshi Kitagawa, all of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/471,621

(22) Filed: Dec. 21, 1999

(30) Foreign Application Priority Data

Dec. 22, 1998 (JP) .................................................. 10-363881
Apr. 16, 1999 (JP) .................................................. 11-109331

(51) Int. Cl.$^7$ ............................ H01G 4/30; H01G 4/228; H01G 4/06
(52) U.S. Cl. ................... 361/301.4; 361/305; 361/306.3; 361/311; 361/313
(58) Field of Search ................................. 361/301.4, 303, 361/305, 306.1, 306.3, 311–313, 321.2, 329, 330

(56) References Cited

U.S. PATENT DOCUMENTS

| 4,471,405 | * | 9/1984 | Howard et al. ........................ 361/305 |
| 5,576,925 | * | 11/1996 | Gorowitz ........................... 361/301.2 |
| 5,973,911 | * | 10/1999 | Nishioka ............................... 361/313 |

FOREIGN PATENT DOCUMENTS

| 62-194606 | 8/1987 | (JP) . |
| 63-86412 | 4/1988 | (JP) . |
| 63-86413 | 4/1988 | (JP) . |
| 63-98115 | 4/1988 | (JP) . |
| 1-175217 | 7/1989 | (JP) . |
| 1-175714 | 7/1989 | (JP) . |
| 8-78283 | 3/1996 | (JP) . |
| 9-17691 | 1/1997 | (JP) . |
| 9-35992 | 2/1997 | (JP) . |

OTHER PUBLICATIONS

Chen et al. "Study of Tantalum Oxide Thin Film Capacitors On Metallized Polymer Sheets for Advanced Packaging Applications". *IEEE Transactions On Components, Packaging, and Manufacturing Technology—Part B*. vol 20, No. 2 May 1997.

Sugii et al. "High–frequency Properties of $SrTiO_3$ Thin–film Capacitors Fabricated On Polymer–coated Alloy Substrates", Appl. Phys. Lett. 72 (2), Jan. 12 1998.

* cited by examiner

*Primary Examiner*—Anthony Dinkins
(74) *Attorney, Agent, or Firm*—Merchant & Gould P.C.

(57) ABSTRACT

According to a flexible thin film capacitor of the present invention, an adhesive film is formed on a substrate composed of at least one selected from the group consisting of an organic polymer and a metal foil, and an inorganic high dielectric film and metal electrode films are formed thereon. A metal oxide adhesive film can be used as the adhesive film. The adhesive film is formed in contact with the inorganic high dielectric film and at least one of the metal electrode films.

14 Claims, 10 Drawing Sheets

FLEXIBLE THIN FILM CAPACITOR HAVING AN ADHESIVE FILM

BACKGROUND OF THE INVENTION

1. Field of the Invention

The present invention relates to a flexible thin film capacitor using a high dielectric thin film, in particular, a flexible thin film capacitor used in flexible and compact portable electronic equipment such as an IC card as a flexible chip capacitor.

2. Description of the Prior Art

In recent years, compact and thin electronic equipment is in demand, and a circuit substrate used in the electronic equipment on which electronic components such as ICs and capacitors are mounted is required to be thin. Especially in a non-contact IC card, the thickness thereof is as thin as 1 mm or less, so that the thickness of the electronic component included therein is required to be several hundreds μm or less. For this reason, in order to obtain a capacitor having a large capacitance, a thin ceramic capacitor divided into several portions is proposed.

When a ceramic capacitor is used in the non-contact IC card, the capacitor cannot be as thin as the IC. In addition, in the case where the ceramic capacitor is mounted on a substrate, it becomes thicker by the contact layer. Furthermore, the mechanical strength becomes poorer as the ceramic capacitor becomes thinner, and therefore, when the ceramic capacitor is bent, it may be broken.

SUMMARY OF THE INVENTION

Therefore, with the foregoing in mind, it is an object of the present invention to provide a high-quality and highly reliable flexible thin film capacitor that results in a thin mounted substrate on which the components are mounted, and is flexible so that it hardly is broken when being bent. Furthermore, it is another object of the present invention to provide a method for producing a flexible thin film capacitor having such excellent characteristics.

In order to achieve the objects, one embodiment of the present invention includes a substrate formed of at least one selected from the group consisting of an organic polymer and a metal foil, and an inorganic high dielectric film and metal electrode films formed on the substrate. The inorganic high dielectric film is interposed between the metal electrode films. The inorganic high dielectric film and at least one of the metal electrode films are formed in contact with an adhesive film on the substrate, thereby being integrated with the substrate by the adhesive film. It is preferable that the adhesive film is a metal oxide adhesive film.

Furthermore, one embodiment of a method for producing a flexible thin film capacitor of the present invention includes forming a first metal electrode film, an inorganic high dielectric film and a second metal electrode film in this order on a substrate formed of at least one selected from the group consisting of an organic polymer and a metal foil, using respective masks. The first metal electrode film and the inorganic high dielectric film are formed in contact with an adhesive film on the substrate, thereby being integrated with the substrate by the adhesive film.

The present invention allows the metal electrode films to adhere to the substrate firmly. In addition, for example, when a metal adhesive film is provided on a surface of an organic polymer, it is possible to form a high dielectric film having a high dielectric constant of $\epsilon_r > 10$ without peeling from the substrate even at a low substrate temperature of about 300° C. Thus, the present invention can provide a high-quality and highly reliable flexible thin film capacitor in which no peeling nor damage occurs when it is bent.

These and other advantages of the present invention will become apparent to those skilled in the art upon reading and understanding the following detailed description with reference to the accompanying figures.

DESCRIPTION OF THE PREFERRED EMBODIMENTS

Figure 1:
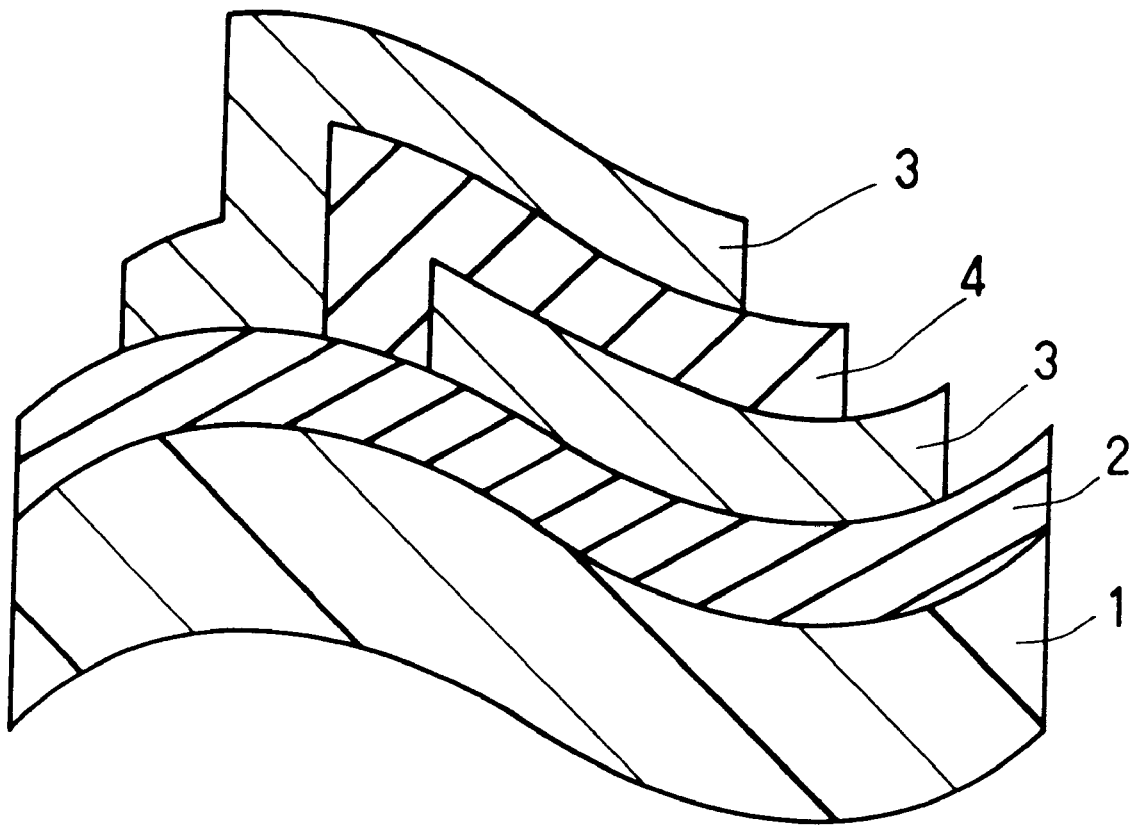
FIG. 1 is a cross-sectional view of an embodiment of a flexible thin film capacitor of the present invention.

In a preferred embodiment of a flexible thin film capacitor of the present invention, an inorganic high dielectric film and at least one metal electrode film are formed in contact with an adhesive film on at least one surface of an organic polymer substrate or a metal foil substrate so as to be integrated with the substrate by the adhesive film. In this case, it is preferable that the adhesive film is a metal oxide adhesive film. Furthermore, a metal adhesive film may be formed between the metal oxide adhesive film and the metal electrode films. It is preferable to form the metal adhesive film in a region except for a portion between the metal oxide adhesive film and the inorganic high dielectric film, namely, within a region where the metal oxide adhesive film and the metal electrode films are in contact with each other.

It is preferable that the adhesive film contains at least one metal selected from the group consisting of Cr, NiCr, Ti, Co, Ge, Cu, Sn, Mo and W, because these metals have excellent adhesion and are advantageous for producing a high-quality and highly reliable flexible thin film capacitor. More specifically, it is preferable that the adhesive film is a metal adhesive film comprising at least one metal of these metals or a metal oxide adhesive film comprising at least one oxide of these metals.

Furthermore, it is preferable that the substrate has a first main surface and a second main surface, the inorganic high dielectric film and the metal electrode films are formed on the first main surface of the substrate, and at least one of the metal electrode films is connected to a metal electrode film on the second main surface of the substrate via a through hole provided on the substrate or via an end face of the substrate. This embodiment facilitates mounting onto the substrate. For example, an IC chip such as an IC card easily can be mounted on the lower surface and connected to the flexible thin film capacitor.

Furthermore, it is preferable that the flexible thin film capacitor further includes a protective film formed on the inorganic high dielectric film and the metal electrode films. This embodiment can provide a flexible thin film capacitor having more excellent mechanical strength. Preferably, the protective film is formed of at least one material selected from the group consisting of $SiO_2$, $Si_3N_4$, $Ta_2O_5$, $Al_2O_3$, a thermosetting resin, and an ultraviolet-curable resin.

Furthermore, the flexible thin film of the present invention can have an entire thickness of not more than 300μm. Thus, the flexible thin film capacitor of the present invention can achieve the targeted thickness for an IC card of 0.76 mm.

Furthermore, it is preferable that when the substrate is an organic polymer substrate, the organic polymer substrate is formed of at least one material selected from the group consisting of polyimide, polyamide, polyimide-amide, polyester and polysulfone. It is preferable that when the substrate is a metal foil substrate, the metal foil substrate is formed of stainless steel. These preferred embodiments make it possible to form an inorganic high dielectric thin film at a temperature of about 300° C. by using a high heat-resistant substrate.

Furthermore, it is preferable that the metal electrode film is formed of at least one material selected from the group consisting of Pt, Ag, Au, Cu, Ni, Al, Pd, Ru and Ir. More preferable materials include at least one material selected from the group consisting of Pt, Ag, Au, Ni, Al, Pd, Ru and Ir. This embodiment allows the electrode to have excellent adhesion with the inorganic high dielectric film and high electrical conductivity.

It is preferable that the inorganic high dielectric film is formed of at least one material selected from the group consisting of $SrTiO_3$, $BaTiO_3$, $PbTiO_3$, $CaTiO_3$, and solid solutions thereof. This embodiment allows the high dielectric thin film to have a high dielectric constant of $\epsilon_r > 10$ at a substrate temperature of 300° C.

Next, one embodiment of a method for producing a flexible thin film capacitor of the present invention includes forming a first metal electrode film, an inorganic high dielectric film and a second metal electrode film on at least one surface of a substrate in contact with an adhesive film on the surface of the substrate, thereby being integrated with the substrate by the adhesive film. Furthermore, a metal oxide adhesive film is formed as the adhesive film, and an additional metal adhesive film can be formed in a region where the first metal electrode film is to be formed on the metal oxide adhesive film. In the present invention, the metal oxide adhesive film and the metal adhesive film may be deposited in this manner. When the second metal electrode film is in contact with the adhesive film, the additional metal adhesive film can be formed in a region where the first and second metal electrode films are to be formed on the metal oxide adhesive film.

It is preferable that the metal electrode film is formed by at least one method selected from the group consisting of DC magnetron sputtering, RF magnetron sputtering, ECR magnetron sputtering, a CVD (chemical vapor deposition) method and a vacuum evaporation method.

It is preferable that the inorganic high dielectric film is formed by at least one method selected from the group consisting of RF magnetron sputtering, ECR magnetron sputtering, a CVD method and a sol-gel process.

It is preferable that the inorganic high dielectric film is formed at a temperature up to 300° C. This embodiment allows a high quality inorganic dielectric thin film with reduced distortion to be formed on the substrate. It is preferable that the inorganic high dielectric film is formed at a deposition rate of not less than 10 nm/min. This embodiment allows a high quality inorganic high dielectric thin film to be produced at low cost.

It is preferable that the metal oxide adhesive film is formed by at least one method selected from the group consisting of RF magnetron sputtering, ECR magnetron sputtering, a vacuum evaporation method, a CVD method and a sol-gel process.

Furthermore, the metal oxide adhesive film may be formed by treating a metal film with a solution. In this case, it is preferable that the metal film is formed by at least one method selected from the group consisting of DC magnetron sputtering, RF magnetron sputtering, ECR magnetron sputtering, a CVD method and a vacuum evaporation method. It is preferable that the solution used for an erosion treatment is at least one selected from the group consisting of concentrated nitric acid, phosphoric acid, chloric acid and perchloric acid.

It is preferable that the metal adhesive film is formed by at least one method selected from the group consisting of DC magnetron sputtering, RF magnetron sputtering, ECR magnetron sputtering, a vacuum evaporation method and a CVD method.

One preferred method for producing a flexible thin film capacitor of the present invention further includes forming a peeling film on a base formed of at least one selected from the group consisting of an inorganic material and a metal material applying an organic polymer material onto the peeling film, and curing the organic polymer material by a heat treatment or light irradiation so as to form the substrate formed of an organic polymer on the peeling film. This embodiment can provide flexible thin film capacitors with varied organic polymers as the substrates.

In this case, the organic polymer material can be at least one liquid substance selected from the group consisting of liquid substances of thermosetting or photocurable polyimide, polyamide, polyimide-amide, polyester, epoxy resin, polyurethane, epoxy acrylate and polyacrylic ester. This embodiment makes it possible to form an organic polymer substrate having a high heat resistance, so that the inorganic high dielectric film can be formed at about 300° C.

It is preferable that the peeling film is formed of at least one material selected from the group consisting of $SiO_2$, $Si_3N_4$ and coating glass. It is preferable that the peeling film is formed by at least one method selected from the group consisting of a vacuum evaporation method, sputtering, a CVD method and a sol-gel process.

In order to peel the organic polymer substrate from the base, a liquid or gas peeling solvent is used. As a liquid peeling solvent, it is preferable to use at least one solution selected from the group consisting of hydrofluoric acid, sodium hydrofluorate, and concentrated phosphoric acid. As a gas peeling solvent, a gas containing at least one gas selected from the group consisting of $CF_4$ and $CHF_3$ is preferable. Furthermore, a mixed gas containing $CF_4$ and $H_2$ is preferable.

Furthermore, it is preferable that the method of the present invention further includes forming a protective film on the first metal electrode film, the inorganic high dielectric film and the second electrode film. It is preferable to form the protective film by at least one method selected from the group consisting of a vacuum evaporation method, sputtering, a CVD method, a sol-gel process, screen printing and coating with a dispenser.

In the above-described flexible thin film capacitor, since a thin organic polymer substrate or metal foil substrate is used as the substrate, the substrate itself is flexible. In addition, the adhesive film is provided on the surface of this substrate to improve the adhesion between the metal electrodes and the inorganic high dielectric thin film and the substrate. Therefore, the present invention can provide a high-quality and reliable flexible thin film capacitor that has a high dielectric constant of, for example, $\epsilon_r > 10$, and hardly is broken when it is bent. The capacitance of the flexible thin film capacitor can range from a low capacitance to a high capacitance.

The flexible thin film capacitor of the present invention can be used, for example as a chip capacitor for smoothing, tuning, or decoupling or the like in flexible and compact portable electronic equipment such as a non-contact IC card.

Hereinafter, the present invention will be described in detail with reference to the accompanying drawings.

EMBODIMENT 1

As shown in FIG. 1, in a flexible thin film capacitor of this embodiment, a metal oxide adhesive layer 2 is formed on a surface of an organic polymer substrate 1. Metal electrode films 3, 3 and an inorganic high dielectric thin film 4 are deposited on a surface of the metal oxide adhesive film 2. The metal electrode films 3, 3 are formed so as to sandwich the inorganic high dielectric film 4.

The metal electrode films 3, 3 and the inorganic high dielectric film 4 are at least partially in contact with the metal oxide adhesive film 2 and adhere to the organic polymer substrate 1 via the metal oxide adhesive film 2. The metal electrode films 3, 3 serve as an upper electrode and a lower electrode, respectively, on both sides of the inorganic high dielectric film 4, so that a thin film capacitor is formed. Although not shown in FIG. 1, the metal electrode film that serves as the upper electrode is extended further on the surface of the metal oxide adhesive film 2 and serves as the lower electrode of a capacitor adjacent to this capacitor. In this manner, the flexible thin film capacitor of the present invention can be constituted by a plurality of thin film capacitors that are connected in series on the substrate.

For the substrate and the films, the aforementioned illustrative materials can be used. The organic polymer substrate 1 typically is a polyimide film. The adhesive film 2 typically is formed of $TiO_2$. The metal electrode film 3 typically is formed of Pt. The inorganic high dielectric film 4 typically is formed of $SrTiO_3$. In the flexible thin film capacitor produced using these materials, no damage nor peeling occurred when it was bent, and the capacitor had good capacitor properties. On the other hand, for comparison, a flexible thin film capacitor without the adhesive film 2 was produced using the same materials as above. In this flexible thin film capacitor, peeling occurred between the substrate and the high dielectric thin film.

EMBODIMENT 2

Figure 2:
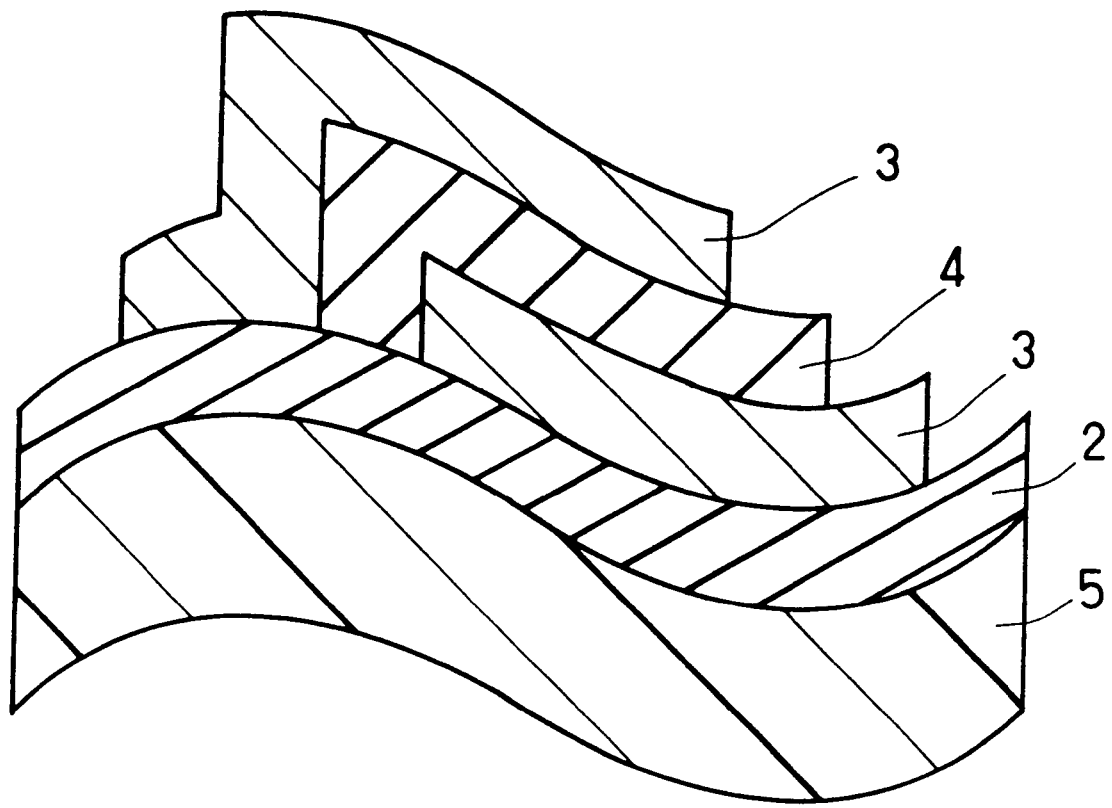
FIG. 2 is a cross-sectional view of another embodiment of a flexible thin film capacitor of the present invention.

As shown in FIG. 2, in the flexible thin film capacitor of this embodiment, a metal foil substrate 5 is used instead of the organic polymer substrate 1 of the flexible thin film capacitor of FIG. 1.

As the metal foil substrate 5, a stainless steel (SUS304) was used. A $TiO_2$ film was formed as the metal oxide adhesive film 2 on the substrate 5 by a sol-gel process. A first Pt electrode film as the metal electrode film 3, an $SrTiO_3$ film as the inorganic high dielectric film 4, and a second Pt electrode film as the metal electrode film 3 were formed on the $TiO_2$ film in this order by RF magnetron sputtering. The Pt electrode films and the $SrTiO_3$ film were formed using respective predetermined masks. In this flexible thin film capacitor, no damage nor peeling occurred when it was bent, and this capacitor had good capacitor properties.

EMBODIMENT 3

Figure 3:
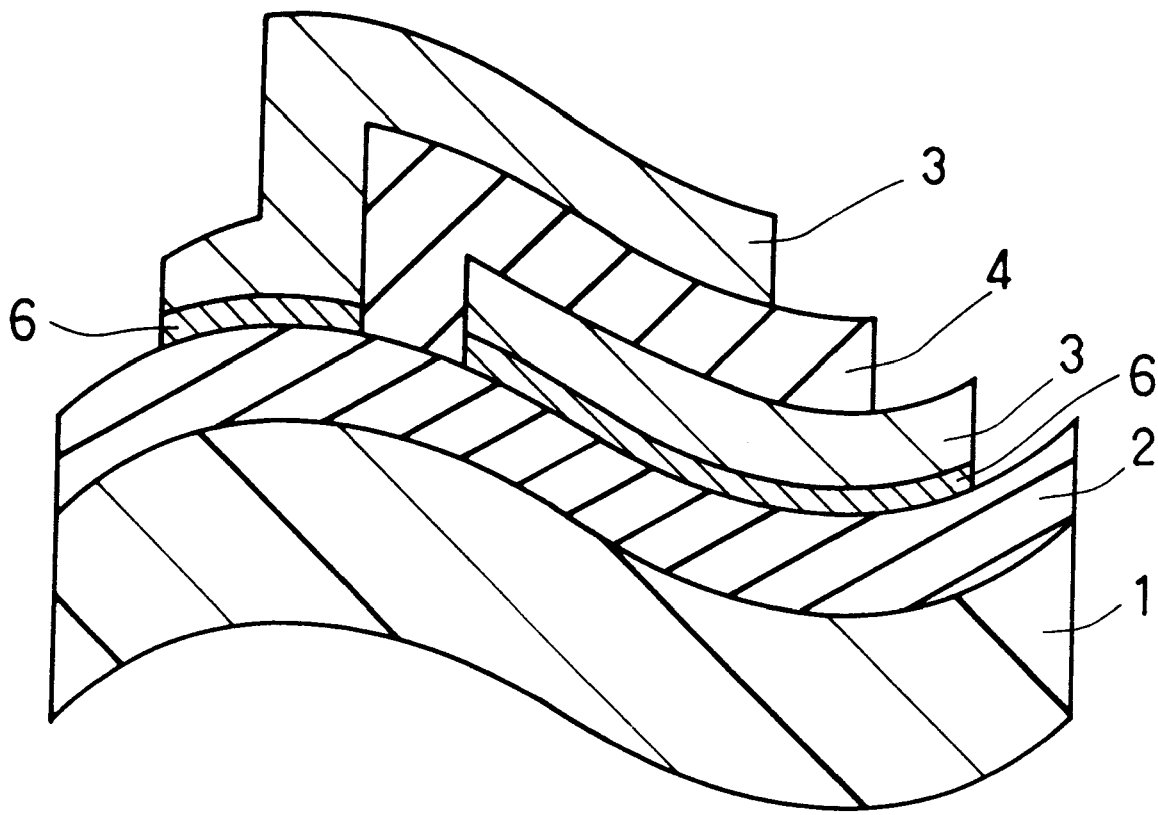
FIG. 3 is a cross-sectional view of yet another embodiment of a flexible thin film capacitor of the present invention.

As shown in FIG. 3, in this embodiment, an additional metal adhesive film 6 is formed between the metal electrode films 3, 3 and the metal oxide adhesive film 2.

A $TiO_2$ film was formed as the metal oxide adhesive film 2 on the substrate 1 composed of polyimide by a sol-gel process. Pt electrode films as the metal electrode films 3, 3 and an $SrTiO_3$ film as the inorganic high dielectric film 4 were formed on a surface of the metal oxide adhesive film 2 in the same manner as in Embodiment 2. In this embodiment, before forming these films, a Ti film was formed as the metal adhesive film 6 only in a region where the metal electrode films 3, 3 were to be formed. The Ti film was formed also by RF magnetron sputtering using a mask. In this flexible thin film capacitor, no damage nor peeling occurred when it was bent, and this capacitor had good capacitor properties.

EMBODIMENT 4

Figure 4:
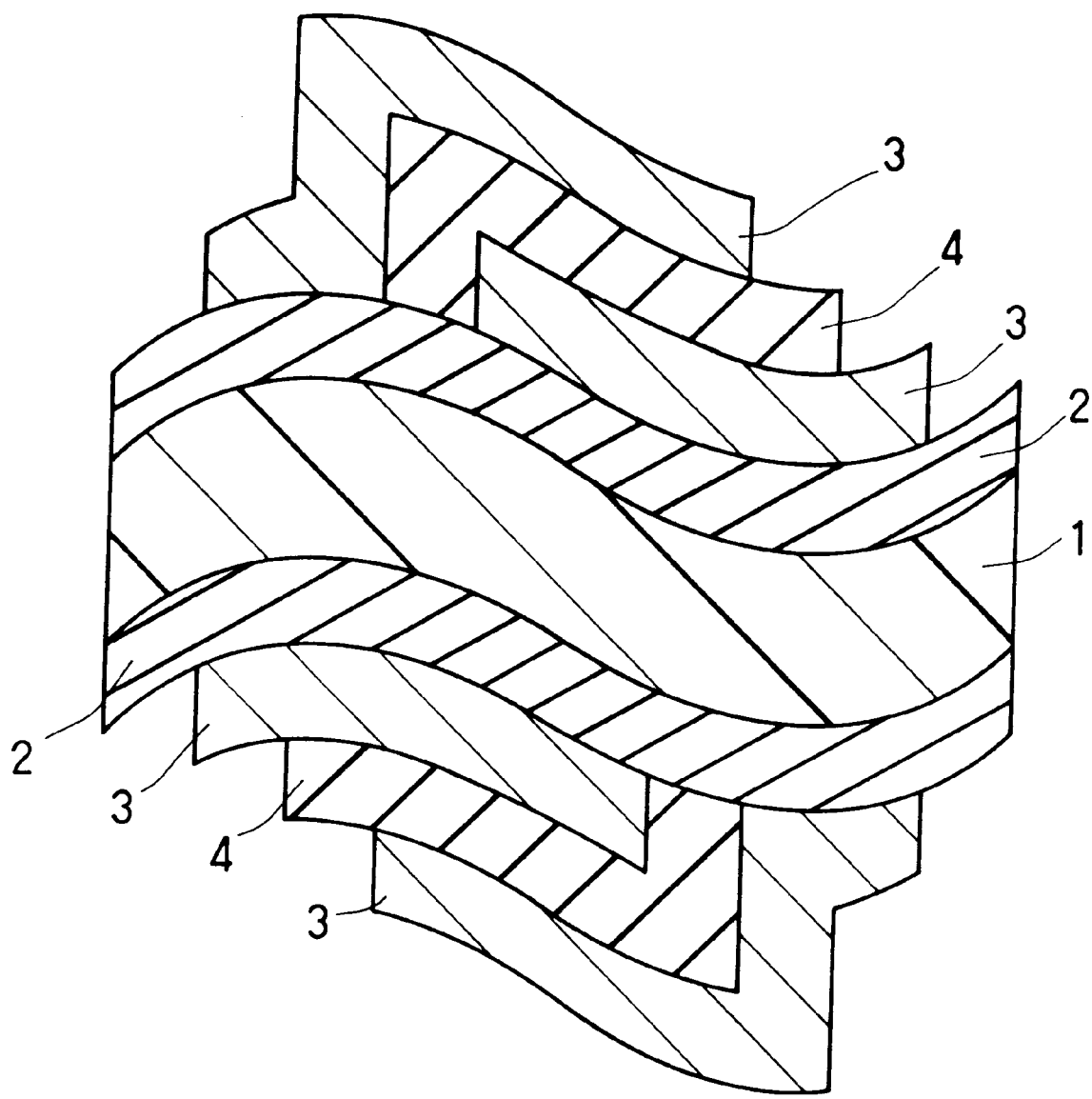
FIG. 4 is a cross-sectional view of still another embodiment of a flexible thin film capacitor of the present invention.

As shown in FIG. 4, in this embodiment, the metal electrode films 3, 3 and the inorganic high dielectric film 4 were formed on both surfaces of the substrate 1.

$TiO_2$ films as the adhesive films were formed on the substrate 1 composed of polyimide by a sol-gel process. Then, the metal electrode films 3, 3 and the inorganic high dielectric film 4 were deposited on each of the surfaces of the substrate 1 by RF magnetron sputtering in the same manner as above. In this flexible thin film capacitor, no damage nor peeling occurred when it was bent, and this capacitor had good capacitor properties.

EMBODIMENT 5

Figure 5:
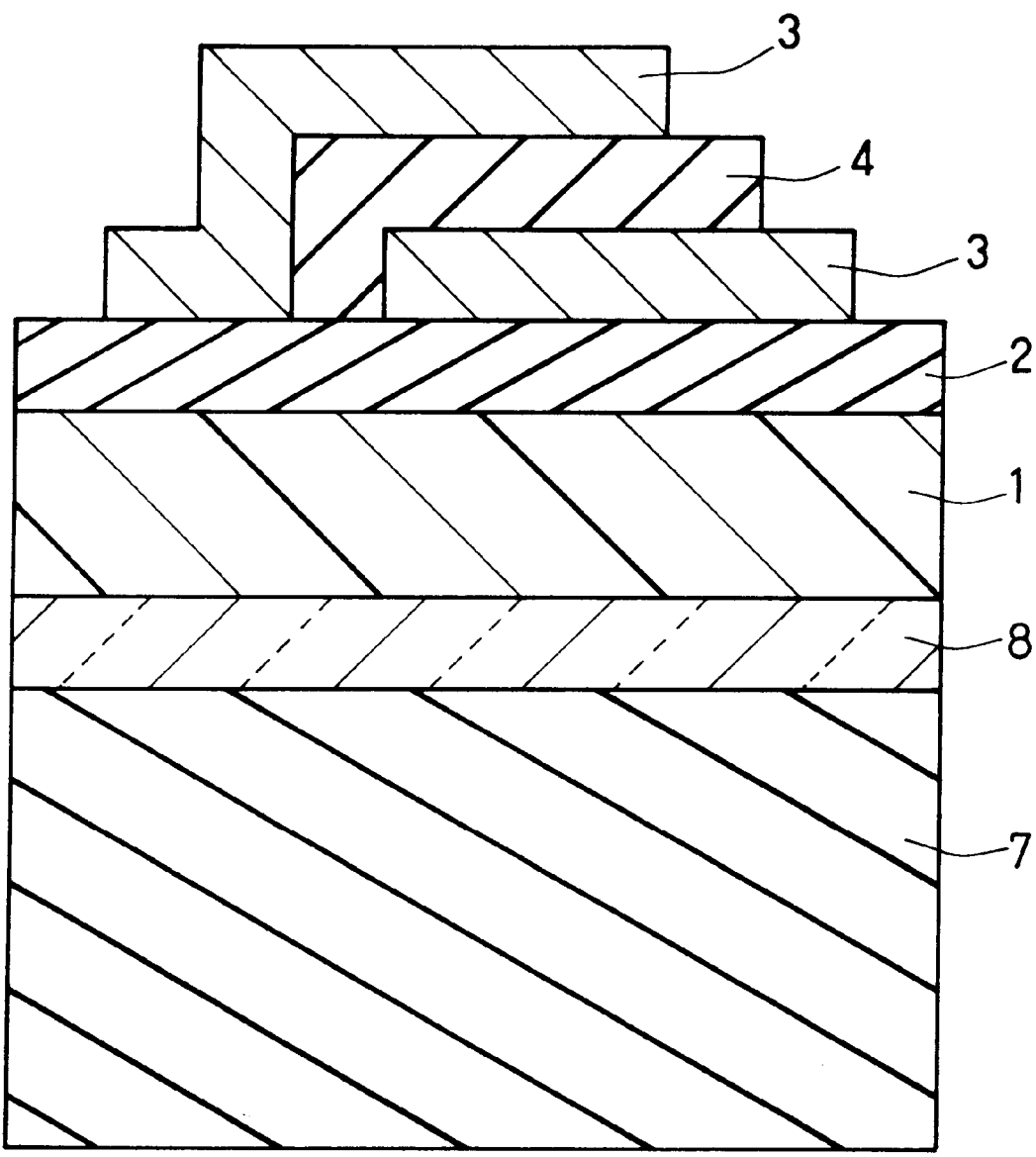
FIG. 5 is a cross-sectional view of another embodiment of a flexible thin film capacitor of the present invention in combination with a base and a peeling film that are used for producing the capacitor.

As shown in FIG. 5, in this embodiment, an organic polymer 1 was formed on a surface of an inorganic base 7 on which a peeling film 8 has been formed beforehand.

The base 7 and the peeling film 8 can be formed of the aforementioned illustrative materials. In this embodiment, an $Al_2O_3$ sheet was used as the inorganic base 7, and a coating glass was used as the peeling film 8. More specifically, liquid polyimide was applied onto the $Al_2O_3$ substrate coated with the coating glass. Then, heating and drying are performed to form an organic polymer substrate 1 composed of polyimide. Then, the metal electrode films 3, 3 and the inorganic high dielectric film 4 were deposited in the same manner as above.

Then, via holes were provided in the lower surface of the $Al_2O_3$ sheet and hydrofluoric acid (hydrogen fluoride solution) was poured from the lower surface of the substrate so that the flexible thin film capacitor was removed from the $Al_2O_3$ sheet. In this flexible thin film capacitor, no damage nor peeling occurred when it was bent, and this capacitor had good capacitor properties.

EMBODIMENT 6

Figure 6:
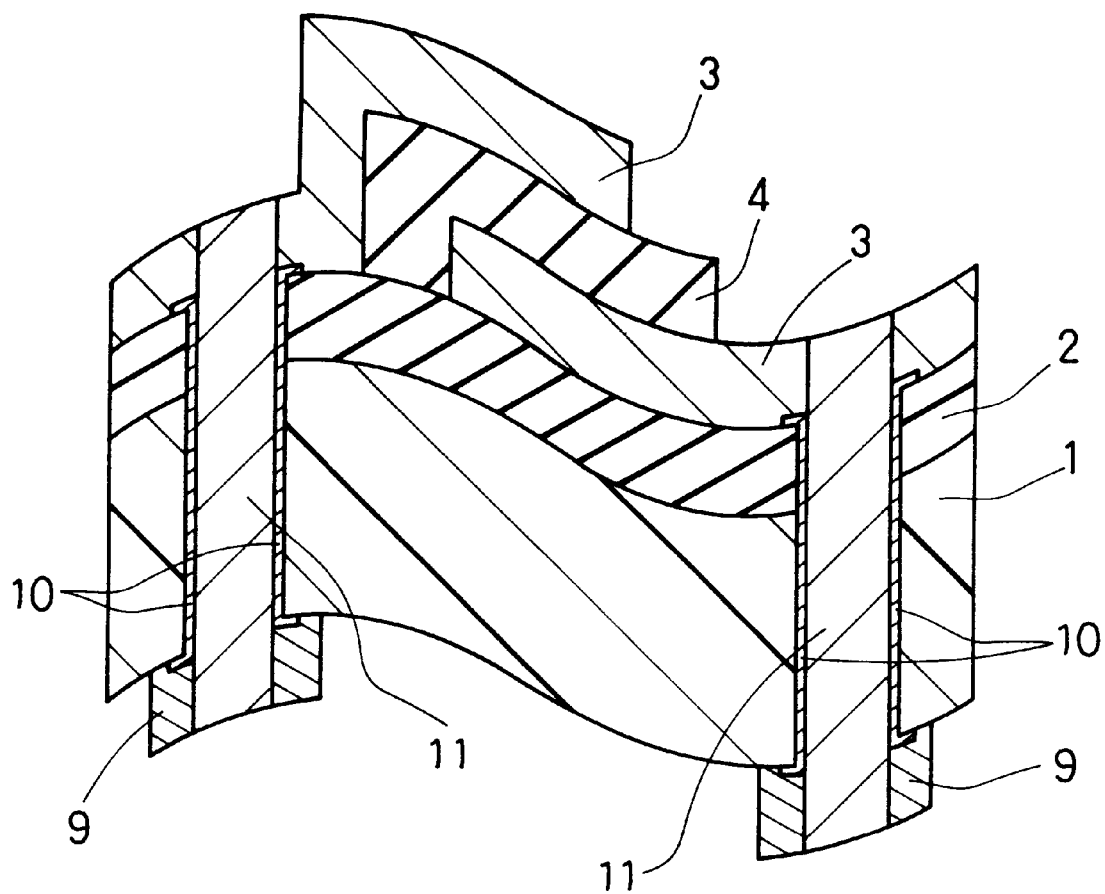
FIG. 6 is a cross-sectional view of yet another embodiment of a flexible thin film capacitor of the present invention.

As shown in FIG. 6, in this embodiment, metal electrodes 9 were formed on the lower surface of the substrate 1, and through holes were formed in the substrate in the cross-sectional direction. The through holes were filled with an electrically conductive paste 11. Furthermore, through-hole plating 10 was provided in the through holes. This electrically conductive paste 11 connects the metal electrode films 3 and 9 on both surfaces of the substrate 1. The through holes were formed in the substrate 1 so that one through hole corresponds to each of the metal electrode films 3, 3 for connection.

In this embodiment, an Al film was used as the metal electrode film 9, and Ag paste was used as the electrically conductive paste 11. In this flexible thin film capacitor, no damage or peeling occurred when it was bent, and this capacitor had good capacitor properties. For comparison, a flexible thin film capacitor without the adhesive film 2 was produced using the same materials as above. In this flexible thin film capacitor, peeling occurred between the substrate and the high dielectric thin film. More specifically, the flexible thin film capacitor provided with the adhesive film retained substantially the same properties as that shown in FIG. 1, even if the flexible thin film capacitor was bent 30 times.

Figure 7:
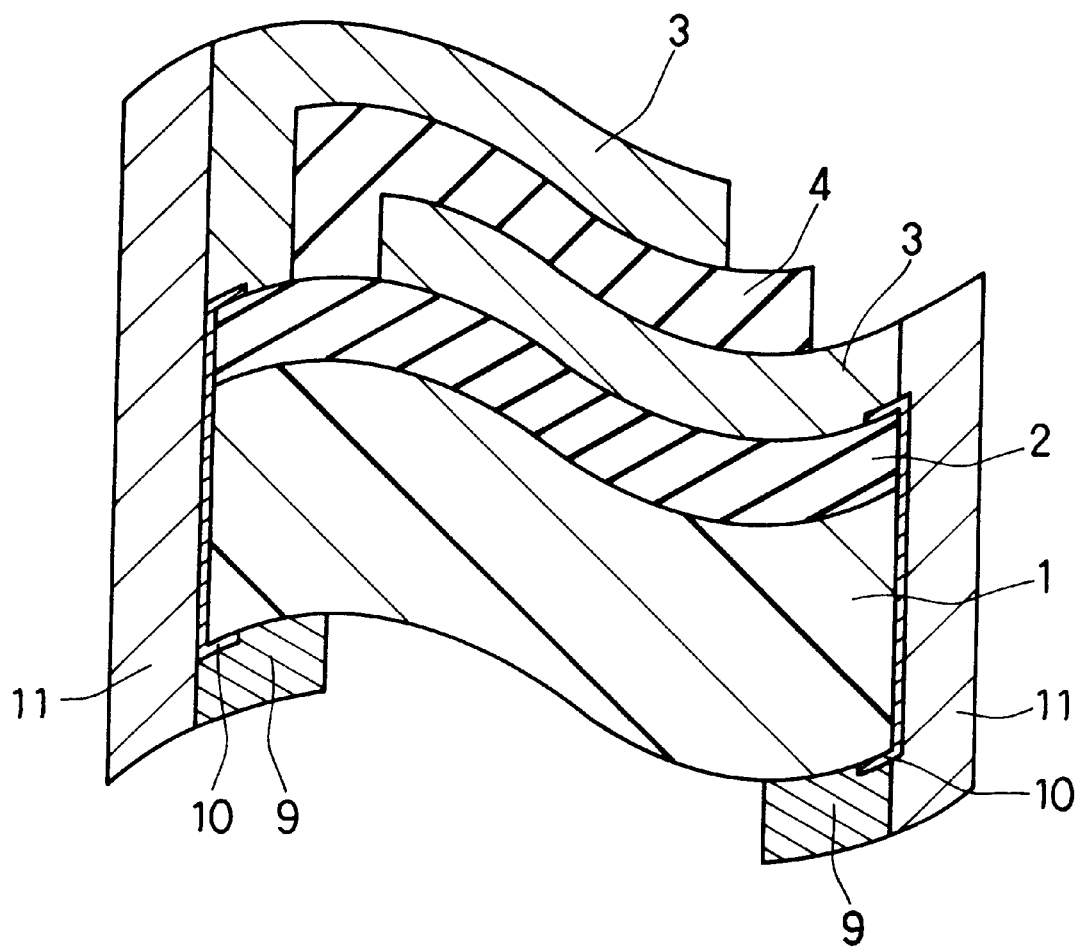
FIG. 7 is a cross-sectional view of still another embodiment of a flexible thin film capacitor of the present invention.

Furthermore, as shown in FIG. 7, the metal electrode films on both surfaces of the substrate may be connected via the end faces of the substrate.

EMBODIMENT 7

Figure 8:
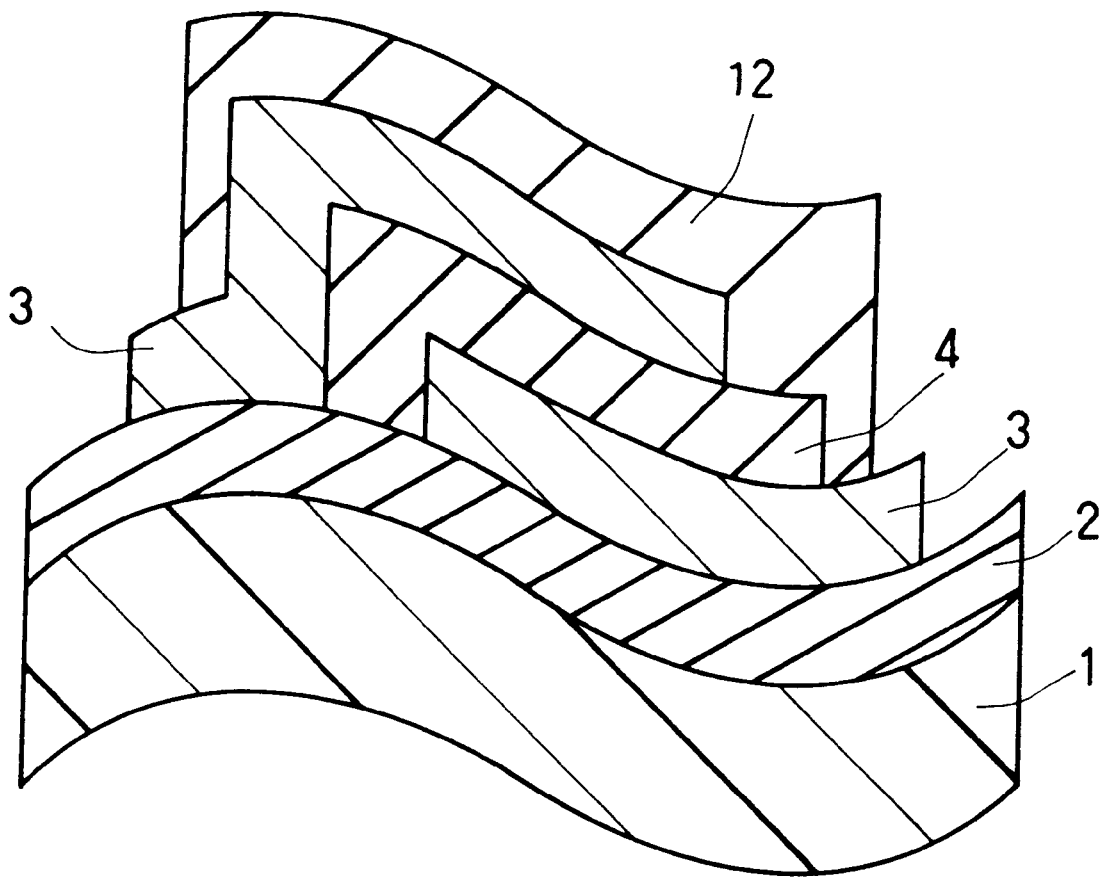
FIG. 8 is a cross-sectional view of another embodiment of a flexible thin film capacitor of the present invention.

As shown in FIG. 8, a protective film 12 is formed in this embodiment. The protective film 12 is formed so as to cover the metal electrode films 3, 3 and the inorganic high dielectric film 4. It is preferable to form the protective film of a material that is impermeable to humidity and is thermally stable. More specifically, the aforementioned materials are preferable. A preferable resin is at least one selected from the group consisting of an epoxy resin, polyurethane, polyimide, epoxy acrylate and polyacrylic ester.

In this embodiment, an $SiO_2$ film was used as the protective film to produce a flexible thin film capacitor. In this flexible thin film capacitor, no peeling occurred even if it was bent several tens of times.

EXAMPLES

Hereinafter, the present invention will be described in detail by way of examples.

EXAMPLE 1

In this example, a flexible thin film capacitor having the same structure as that in FIG. 1 was produced.

A metal oxide adhesive film was formed of $TiO_2$ on a polyimide substrate 100 μm thick by a sol-gel process using the hydrolysis reaction of $Ti(OC_2H_5)_4$. The thickness of the adhesive film was about 10 nm.

This substrate was fired in a drying chamber at 200° C. for about one hour. Then, a lower electrode was formed of Pt by RF magnetron sputtering. Pt was sputtered in a high vacuum chamber at about $10^{-6}$ Torr (about $10^{-4}$ Pa), in an Ar atmosphere, at a RF power of 200W, at a film-forming pressure of 8 mTrr (about 1 Pa), and at a substrate temperature of 25° C. The thickness of Pt was about 100 nm, and the evaporation rate was about 10 nm/min. The Pt electrode having a size of 5×5 mm was formed using a metal mask.

After the Pt electrode was formed, an $SrTiO_3$ film was formed. The sputtering for the $SrTiO_3$ film was performed in a high vacuum chamber at about $10^{-4}$ Pa, in a mixed atmosphere of $Ar/O_2=2/1$, at a RF power of 800W, at a film-forming pressure of 0.8 Pa, and at a substrate temperature of 300° C. The thickness of the $SrTiO_3$ film was about 300 nm, and the film-deposition rate was about 30 nm/min. The surface area of the $SrTiO_3$ film on the Pt electrode was 4×5 mm. After the $SrTiO_3$ film was formed, another Pt electrode was formed under the same conditions as those for the first layer of Pt. The surface area of the $SrTiO_3$ film sandwiched by the Pt electrodes was 3×5 mm.

Thus, a flexible thin film capacitor was produced. This flexible thin film capacitor was not broken when it was bent, and no peeling occurred between the deposited films. Furthermore, the characteristics were $\epsilon_r \approx 50$ at a measurement frequency of 1 kHz, a capacitance C of 23 nF, a loss tan δ=0.5%, and IR≈$10^{11}$ Ω at an applied voltage of 5V.

On the other hand, when a flexible thin film capacitor was formed directly on a polyimide substrate that was not provided with the $TiO_2$ adhesive film under the same conditions, the Pt electrodes and the $SrTiO_3$ thin film peeled from the polyimide substrate, so that the capacitor properties were not obtained.

Furthermore, when the adhesive film was formed under the same conditions as above, and 64 devices were produced in the form of 8×8 on a polyimide substrate of 10×10 cm, no peeling occurred on the entire surface of the substrate, and the devices had substantially equal capacitor properties.

Thus, when the flexible thin film capacitor of the present invention is used, no damage was caused even if it was bent, or no peeling occurred between the deposited films on the organic polymer substrate. In addition, it is possible to produce a flexible thin film having a dielectric constant of $\epsilon_r > 10$. Thus, the present invention can provide a high-quality and highly reliable flexible thin film capacitor.

EXAMPLE 2

In this example, a flexible thin film capacitor having the same structure as in FIG. 2 was produced in the same manner as in Example 1 except that SUS304 100 μm thick was used as the substrate.

When a flexible thin film capacitor was produced as described above, this flexible thin film capacitor was not broken when it was bent, and no peeling occurred between the deposited films. Furthermore, the characteristics were $\epsilon_r \approx 50$ at a measurement frequency of 1 kHz, a capacitance C of 23 nF, a loss tan δ=0.5%, and IR≈$10^{11}$ Ω at an applied voltage of 5V.

On the other hand, when a flexible thin film capacitor was formed directly on an SUS304 substrate that was not provided with the $TiO_2$ adhesive film under the same conditions, the $SrTiO_3$ thin film peeled from the SUS304 substrate, so that the capacitor properties were not obtained.

Furthermore, when the adhesive film was formed under the same conditions, and 64 devices were produced in the form of 8×8 on an SUS304 substrate of 10×10 cm, no peeling occurred on the entire surface of the substrate, and the devices had substantially equal capacitor properties.

EXAMPLE 3

In this example, a flexible thin film capacitor having the same structure as that in FIG. 3 was produced.

A metal oxide adhesive film was formed of $TiO_2$ on a polyimide substrate 100 μm thick by a sol-gel process using the hydrolysis reaction of $Ti(OC_2H_5)_4$. The thickness of $TiO_2$ was about 10 nm.

This substrate was fired in a drying chamber at 200° C. for about one hour. Then, a Ti metal adhesive film was formed by RF magnetron sputtering. Ti was sputtered in a high vacuum chamber in the $10^{-4}$ Pa range, in an Ar atmosphere, at a RF power of 200W, at a film-forming pressure of 0.8 Pa, and at a substrate temperature of 25° C. The thickness of Ti was about 10 nm, and the evaporation rate was about 10 nm/min.

The Ti metal adhesive film was formed so as to have a size of 5×5 mm using a metal mask. Then, a lower electrode was formed of Pt by RF magnetron sputtering. Pt was sputtered under the same conditions as those in Example 1. The Pt electrode film was formed on the Ti film so as to have the same size using a metal mask. After the Pt electrode was formed, an $SrTiO_3$ film was formed. The sputtering for the $SrTiO_3$ film was performed under the same conditions as those in Example 1. After the $SrTiO_3$ film was formed, another Pt electrode was formed under the same conditions as those in Example 1.

Thus, a flexible thin film capacitor was produced. This flexible thin film capacitor was not broken when it was bent, and no peeling occurred between the deposited films. Furthermore, the characteristics were $\epsilon_r \approx 50$ at a measurement frequency of 1 kHz, a capacitance C of 23 nF, a loss tan $\delta = 0.5\%$, and $IR \approx 10^{11}$ $\Omega$ at an applied voltage of 5V.

A high temperature loading test at 125° C. and a voltage applied of 12.5V and a high humidity loading test at RH 95% and a voltage applied of 12.5V were performed in order to compare the flexible thin film capacitor produced in the Example 1 that was not provided with the Ti adhesive film. For the flexible thin film capacitor produced in the Example 1, various properties were degraded after about 1000 hours passed. On the other hand, the flexible thin film capacitor produced in this example, the properties were not degraded but stable after about 1000 hours passed.

Furthermore, when the adhesive film was formed under the same conditions, and 64 devices were produced in the form of 8×8 on a polyimide substrate of 10×10 cm, no peeling occurred on the entire surface of the substrate, and the devices had substantially equal capacitor properties.

EXAMPLE 4

In this example, similar flexible thin film capacitors having a thickness of 100 $\mu$m were produced using polyamide, polyimide-amide, aromatic polyester or polysulfone, instead of the polyimide substrate used in Example 1. These flexible capacitors were produced under the same conditions as those in Example 1 except that the substrate temperature was 250° C.

Table 1 shows the dielectric constant of each flexible thin film capacitor.

TABLE 1

Dependence of Dielectric constant on Substrate material

| Substrate | Dielectric constant |
|---|---|
| polyimide | 50 |
| polyamide | 40 |
| polyimide-amide | 40 |
| polyester | 40 |
| polysulfone | 35 |

All of the flexible thin film capacitors had a high dielectric constant of $\epsilon_r > 30$, and no damage nor peeling occurred when they were bent.

EXAMPLE 5

In this example, flexible thin film capacitors were produced using Ag, Au, Cu, Ni, Al, Pd, Ru or Ir, instead of the Pt electrode used in Example 1. The production conditions were the same as those in Example 1.

Table 2 shows the dielectric constant of each flexible thin film capacitor.

TABLE 2

Dependence of Dielectric constant on Electrode material

| Electrode | Dielectric constant |
|---|---|
| Pt | 50 |
| Ag | 45 |
| Au | 40 |
| Cu | 30 |
| Ni | 35 |
| Al | 40 |
| Pd | 45 |
| Ru | 45 |
| Ir | 35 |

All of the flexible thin film capacitors had a high dielectric constant of $\epsilon_r > 30$, and no peeling nor damage occurred when they were bent.

However, an oxidation-resistant and thermally stable material is preferable for the electrode, because the electrode material is to be subjected to an oxygen atmosphere at a substrate temperature of about 300° C. during formation of the $SrTiO_3$ thin film. From this viewpoint, Pt, Ag, Pd or Ru is most preferable. Furthermore, Ni or Al is preferable in view of the cost. The capacitor properties were best when Pt was used.

EXAMPLE 6

In this example, flexible thin film capacitors were produced in the same manner as in Example 1 except that the Pt electrode was formed by an EB evaporation technique. The EB evaporation was performed in a high vacuum chamber in the $10^{-4}$ Pa range and at a substrate temperature of RT (room temperature).

In all of the flexible thin film capacitors, no peeling nor damage occurred when they were bent, and they had capacitor properties substantially equal to those of Example 1.

Even if the metal electrode film was formed by DC magnetron sputtering, ECR magnetron sputtering, or a vacuum evaporation method other than the EB evaporation technique, substantially the same effect can be obtained. However, DC magnetron sputtering and RF magnetron sputtering are most preferable in view of the automation and the continuous operations of the vacuum apparatus.

EXAMPLE 7

In this example, flexible thin film capacitors were produced in the same manner as in Example 1, except that $BaTiO_3$, $PbTiO_3$, $CaTiO_3$, $(Ba_{0.2}Sr_{0.8})TiO_3$ in the form of solid solution, $(Pb_{0.1}Sr_{0.9})TiO_3$ in the form of solid solution, or $(Ca_{0.1}Sr_{0.9})TiO_3$ in the form of solid solution was used instead of the $SrTiO_3$ film. Furthermore, for comparison, a flexible thin film capacitor was produced using $BiTiO_x$ in the same manner. The production conditions of the films were the same as those in Example 1.

Table 3 shows the dielectric constant of each flexible thin film capacitor.

TABLE 3

Dependence of Dielectric constant on Dielectric thin film material

| Dielectric thin film | Dielectric constant |
|---|---|
| $SrTiO_3$ | 50 |
| $BaTiO_3$ | 20 |
| $PbTiO_3$ | 45 |
| $CaTiO_3$ | 15 |
| $(Ba_{0.2}Sr_{0.8})TiO_3$ | 65 |
| $(Pb_{0.1}Sr_{0.9})TiO_3$ | 60 |
| $(Ca_{0.1}Sr_{0.9})TiO_3$ | 40 |
| $BiTiO_x$ | 5 |

In all of the flexible thin film capacitors, no peeling nor damage occurred when they were bent. In addition, all the capacitors except the capacitor using $BiTiO_x$ (e.g., $BiTiO_3$) had a high dielectric constant of $\epsilon_r > 10$. In particular, when $(Pb_{0.1}Sr_{0.9})TiO_3$ was used, the dielectric constant was $\epsilon_r \approx 60$, which is higher than the dielectric constant of $SrTiO_3$. Using $(Ba_{0.2}Sr_{0.8})TiO_3$ resulted in the best capacitor property of $\epsilon_r \approx 65$.

EXAMPLE 8

In this example, flexible thin film capacitors were produced in the same manner as in Example 1, except that the $SrTiO_3$ film was formed by a MOCVD method. In the MOCVD, 0.1 mol/L of $Sr(DPM)_2[Sr(C_{11}H_{19}O_2)_2]$ contained in a solution of $THF[C_4H_8O]$ was used as the Sr source. $TTIP[Ti(O-iC_3H_7)_4]$ was used as the Ti source. The Sr source and the Ti source were supplied onto the substrate at flow rates of 0.5 cm$^3$/min and 0.8 cm$^3$/min, respectively, using $N_2$ as the carrier gas. $O_2$ and $N_2O$ were introduced thereto at a flow rate of 8 slm. Thus, an $SrTiO_3$ film was formed in the film-forming atmosphere at 30 Torr (about 4000 Pa). The substrate temperature was 300° C. The thickness of the $SrTiO_3$ film was 300 nm. The deposition rate was about 10 nm/min. All the conditions except for the conditions for forming the inorganic high dielectric film were the same as those in Example 1. In all of the thus obtained flexible thin film capacitors, no peeling nor damage occurred when they were bent. The value of $\epsilon \approx 30$ was obtained for the capacitor properties.

Substantially the same effect was obtained when RF sputtering, ECR magnetron sputtering, the gel-sol process, or a CVD method other than the MOCVD method was used to form the inorganic high dielectric film. However, RF magnetron sputtering is preferable in view of the improvement of the film-formation rate, the quality of the formed film, and the automation and the continuous operations of the vacuum apparatus.

EXAMPLE 9

In this example, the substrate temperature during formation of the $SrTiO_3$ film in the production conditions of Example 1 was examined. The conditions except for the substrate temperature were the same as those in Example 1.

Figure 9:
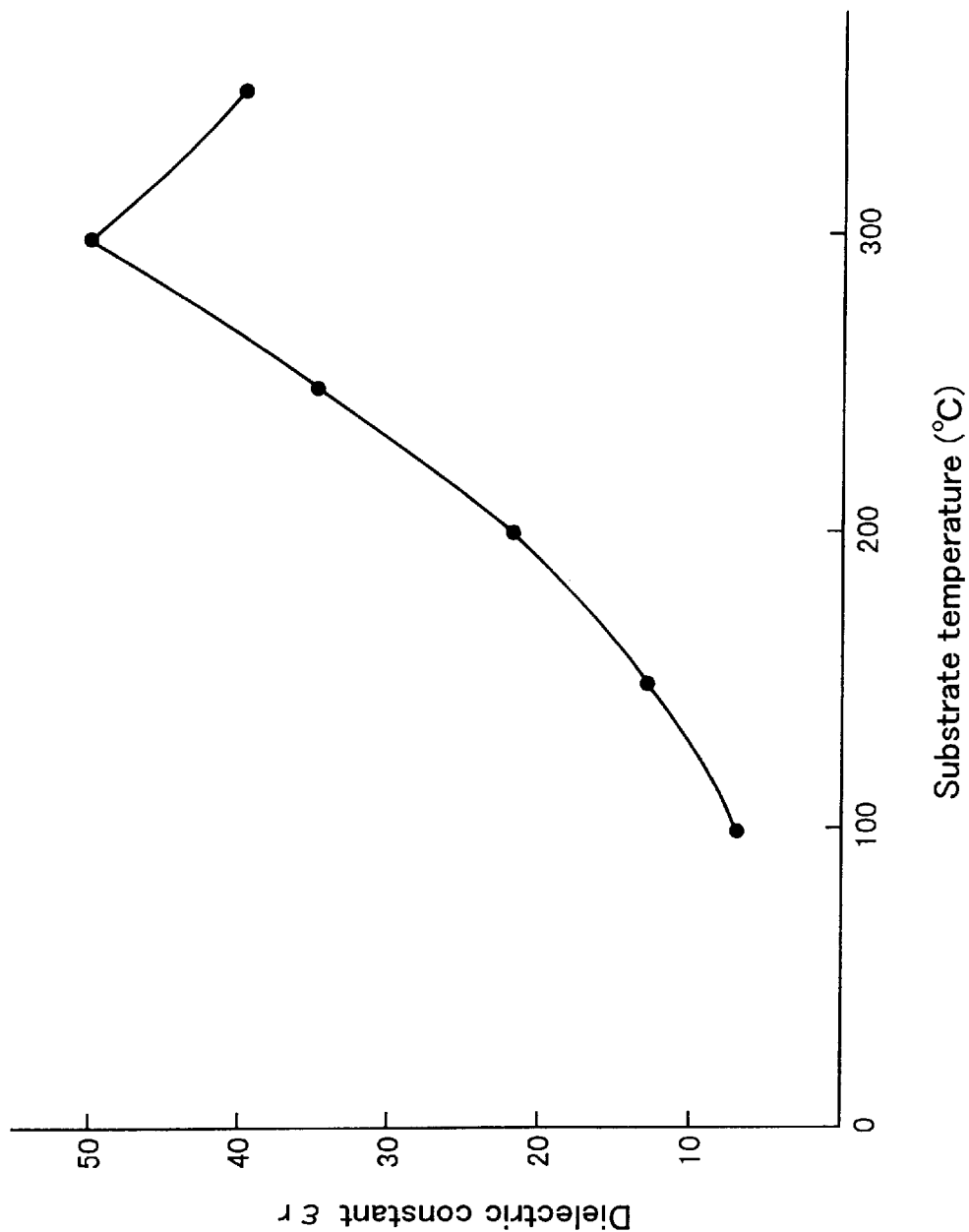
FIG. 9 is a graph showing the relationship between the dielectric constant and the temperature of the substrate during production of an example of a flexible thin film capacitor of the present invention.

FIG. 9 shows the relationship between the substrate temperature and the dielectric constant of the flexible thin film capacitor. The dielectric constant of the capacitor increases with increasing substrate temperature up to 300° C. The improvement of the dielectric constant leads to an improvement of the capacitance of the capacitor, so that the capacitor can have a larger capacitance in the same area. Therefore, this is advantageous for providing a compact capacitor at a low price. On the other hand, when the substrate temperature exceeds 300° C., the substrate is distorted, resulting in reduced dielectric constants. Consequently, it is preferable that the upper limit of the substrate temperature is 300° C., especially when an organic polymer substrate is used.

EXAMPLE 10

In this example, the RF power during formation of the $SrTiO_3$ film in the production conditions of Example 1 was examined. The conditions except for the RF power were the same as those in Example 1.

Figure 10:
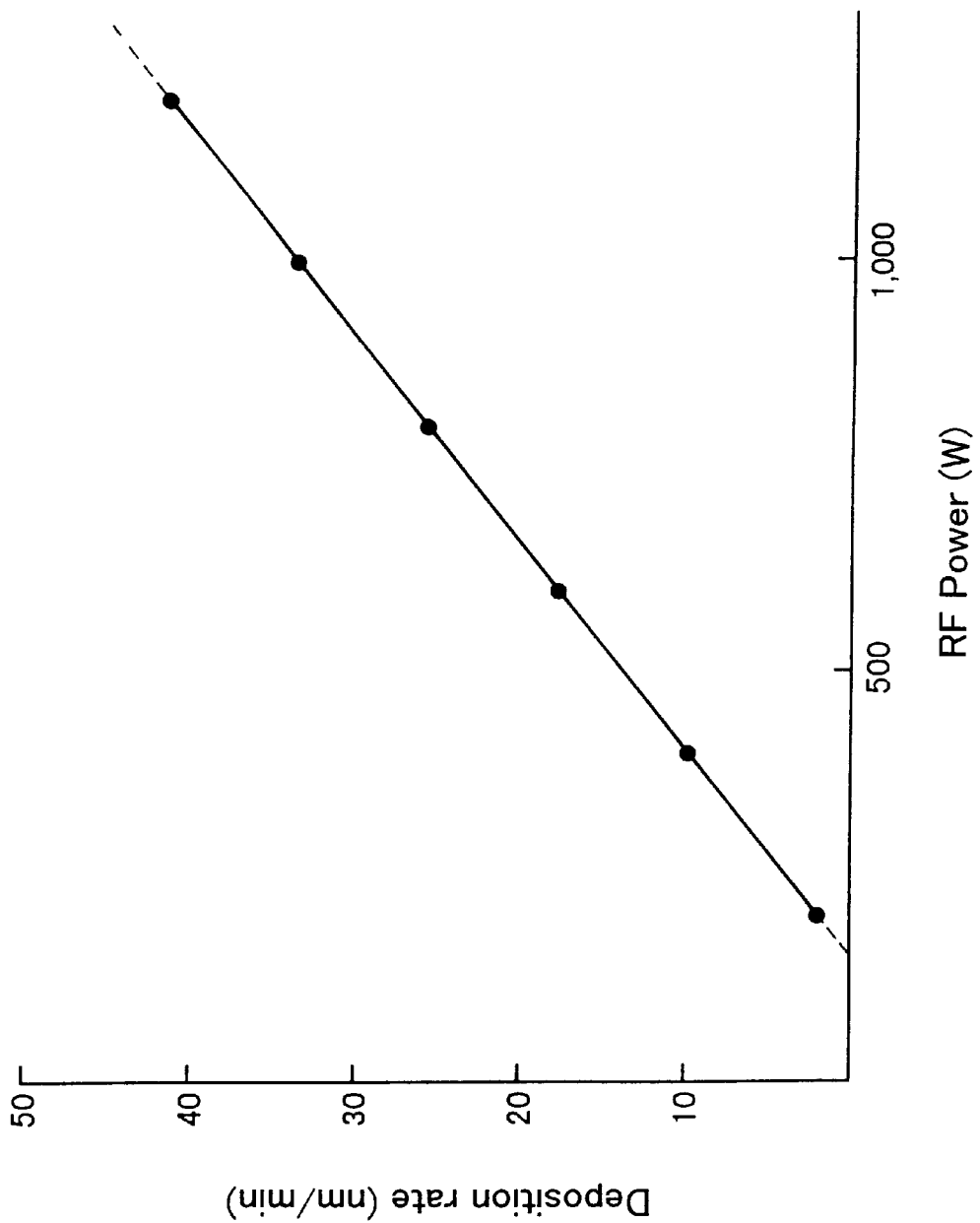
FIG. 10 is a graph showing the relationship between the deposition rate and the film-formation conditions of an example of an inorganic high dielectric film of a flexible thin film capacitor of the present invention.

FIG. 10 shows the relationship between the RF power and the deposition rate of the $SrTiO_3$ film. The graph shows that the deposition rate increases linearly with increasing RF power. In addition, it was confirmed that the dielectric constant of the capacitor was not degraded even if the deposition rate was raised.

The improvement of the deposition rate leads to an improvement of the throughput, so that the flexible thin film capacitor can be provided at a low cost. Therefore, it is preferable to form the inorganic high dielectric thin film at a rate of 10 nm/min.

EXAMPLE 11

In this example, flexible thin film capacitors were produced in the same manner as in Example 1, except that the $CrO_x$, which is an oxide of Cr, was used instead of the $TiO_2$ adhesive film. $CrO_x$ was produced by the EB evaporation technique. The EB evaporation was performed in a high vacuum chamber in the $10^{-4}$ Pa range at a substrate temperature of 25° C. The thickness of $CrO_x$ was about 10 nm. The capacitors were produced under the same conditions as those in Example 1 except for the adhesive film. In all of the thus obtained flexible thin film capacitors, no peeling nor damage occurred when they were bent, and they had good capacitor properties.

Substantially the same effect was obtained when NiCr, Co, Ge, Cu, Sn, Mo or W was used as the metal for forming the metal oxide adhesive film, instead of Ti or Cr. Substantially the same effect was obtained when RF magnetron sputtering, ECR magnetron sputtering, a CVD method or a vacuum evaporation method other than the EB evaporation technique was used to form the metal oxide adhesive film. However, sputtering is preferable in view of the production cost and the ease of the formation of the thin film.

EXAMPLE 12

In this example, instead of the $CrO_x$ adhesive film used in Example 11, a Cr thin film having a thickness of about 100 nm was formed by the EB evaporation technique and was subjected to an erosion treatment in a concentrated nitric acid solution so as to form a Cr oxide film. The erosion treatment in a concentrated nitric acid solution was performed by immersing the Cr thin film in a 10% nitric acid solution at room temperature for about 10 minutes. When the composition on the surface of the film was analyzed according to the Auger electron spectroscopy, it was confirmed that an oxide of Cr was formed. In all of the thus obtained flexible thin film capacitors, no peeling nor damage occurred when they were bent, and they had good capacitor properties.

Substantially the same effect was obtained when an NiCr, Ti, Co, Ge, Al, Cu, Ag, Sn, Mo or W thin film was used instead of the Cr thin film and was subjected to the same oxidation treatment.

Substantially the same effect was obtained when phosphoric acid, chloric acid, or perchloric acid was used for oxidation. Furthermore, substantially the same effect was obtained when DC magnetron sputtering, RF magnetron sputtering, ECR magnetron sputtering, a CVD method or a vacuum evaporation method other than the EB evaporation technique was used to form the metal film. However, the sol-gel process is preferable for formation of the oxide in view of the production cost and the ease of the formation of the oxide thin film.

EXAMPLE 13

In this example, flexible thin film capacitors were produced in the same manner as in Example 2, except that a Cr adhesive film was used instead of the Ti adhesive film. The Cr film was formed by RF magnetron sputtering under the same conditions as the Ti film was formed. The thickness of the Cr film was about 10 nm. In all of the thus obtained flexible thin film capacitors, no peeling nor damage occurred when they were bent, and they had good capacitor properties.

Substantially the same effect was obtained when NiCr, Co, Ge, Cu, Sn, Mo or W was used as the metal for forming the adhesive film, instead of Ti or Cr.

EXAMPLE 14

In this example, flexible thin film capacitors having the same structure as that of FIG. 4 were produced. A capacitor was formed on one surface of the substrate in the same manner as in Example 1. Then, another capacitor was formed on the other surface of the substrate in the same manner as in Example 1. The $TiO_2$ adhesive films were formed on both of the surfaces of the polyimide substrate at the same time.

In all of the thus obtained flexible thin film capacitors, no peeling nor damage occurred when they were bent. Furthermore, the capacitors on both of the surfaces had good capacitor properties.

EXAMPLE 15

In this example, a flexible thin film capacitor having the same structure as that of FIG. 5 was produced.

A peeling film composed of coating glass ($SiO_2$ glass) by the sol-gel process using the hydrolysis reaction of $Si(OC_2H_5)_4$ was formed on an $Al_2O_3$ base 0.5 mm thick. The thickness of the coating glass film was about 100 nm. Furthermore, liquid polyimide was applied thereto by spin-coating. The thickness of the polyimide film was about 200 $\mu$m. This was allowed to stand in a drying chamber at 300° C. for about one hour so that the polyimide was cured by heat. An adhesive film, metal electrode films and an inorganic high dielectric film were formed on this substrate in the same manner as in Example 1. After a capacitor was formed, a plurality of via holes having a diameter of 1 mm were formed at intervals of 10 mm from the lower surface of the $Al_2O_3$ base. Hydrofluoric acid was poured through the via holes so as to etch the peeling film. Thus, the flexible thin film capacitor was removed from the $Al_2O_3$ base, which served as the support substrate, and was dried in a drying chamber at 100° C. for 30 minutes.

Substantially the same effect was obtained when an inorganic substrate such as glass, Si single crystal or a metal substrate such as a Al metal foil was used as the support substrate, instead of the $Al_2O_3$ sheet. In particular, when Si single crystal is used as the substrate, an $SiO_2$ film can be formed easily by subjecting the Si surface to thermal oxidation, and the Si substrate can be reused after the peeling film is removed therefrom.

Substantially the same effect was obtained when thermosetting or photocurable polyamide, polyimide-amide, polyester, an epoxy resin, polyurethane, epoxy acrylate, or polyacrylic ester was used as the material for the organic polymer substrate, instead of polyimide. However, it is preferable to use polyimide, because the flexible thin film capacitor using polyimide has excellent capacitor properties and heat resistance.

Furthermore, substantially the same effect was obtained when ultraviolet ray irradiation with a mercury lamp was used instead of heat curing to cure the liquid organic polymer material.

Furthermore, substantially the same effect was obtained when $SiO_2$ or $Si_3N_4$ was used as the peeling film, instead of coating glass. However, coating glass is preferable because of its high etching rate.

Furthermore, substantially the same effect was obtained when a vacuum evaporation method, sputtering and a CVD method was used to form the peeling film. However, the sol-gel process is preferable in view of the production cost and the ease of the formation of the peeling film.

Furthermore, substantially the same effect was obtained when hydrofluoric acid or sodium hydrofluorate was used for $SiO_2$ and coating glass, and concentrated phosphoric acid was used for $Si_3N_4$ as a liquid solvent for etching the peeling film.

Furthermore, substantially the same effect was obtained when $CF_4$, $CF_4+H_2$, or $CHF_3$ was used as a gas solvent for etching the peeling film.

EXAMPLE 16

In this example, a flexible thin film capacitor having the same structure as that of FIG. 6 was produced.

Holes having a diameter of 0.4 mm were provided in a polyimide substrate and a metal oxide adhesive film was formed on the substrate. Then, through hole plating was performed, and Al electrodes for interconnection were formed on the lower surface of the substrate by RF magnetron sputtering. The Al electrodes were formed in a high vacuum chamber in the $10^{-5}$ Pa range in an Ar atmosphere at a RF power of 200W, a film-forming pressure of 0.8 Pa, and a substrate temperature of 25° C. The thickness of the Al film was about 100 nm. The evaporation rate was about 10 nm/min. Then, a Pt electrode film was formed on the upper surface of the substrate so as to cover a through hole so that the Pt electrode was connected to the Al electrode for interconnection on the lower surface. Thereafter, an $SrTiO_3$ film was formed and another Pt electrode film was formed thereon.

The flexible thin film capacitor on the upper surface was formed in the same manner as in Example 1. An electrically conductive paste of Ag was filled and solidified for connection between the metal electrodes on the upper surface and the lower substrate to ensure stable connection.

When a flexible thin film capacitor was formed on the lower surface of the organic polymer substrate, the flexible thin film capacitor was not broken when it was bent, and no peeling was observed between the deposited films.

When the characteristics of the flexible thin film capacitor using the lower electrodes as the interconnection electrodes were evaluated, the characteristics were substantially the same as those of the flexible thin film capacitor of Example 1.

Furthermore, substantially the same effect was obtained in a flexible thin film capacitor as shown in FIG. 7 in which the metal electrodes on the upper surface of the substrate are connected to the metal electrodes on the lower surface through the end faces of the substrate, instead of the through holes provided in the substrate.

EXAMPLE 17

In this example, a flexible thin film capacitor having the same structure as that of FIG. 8 was produced.

A $Si_3N_4$ film was formed as a protective film by RF magnetron sputtering. The $Si_3N_4$ film was formed in a high vacuum chamber in the $10^{-4}$ Pa range in a mixed atmosphere of $Ar/N_2=2/1$, at a RF power of 200W, a film-forming pressure of 8 mTorr, and a substrate temperature of RT. The thickness of the $Si_3N_4$ film was about 100 nm. The deposition rate for the film as about 10 nm/min.

The flexible thin film capacitors provided with and without the protective film were prepared. In either types of the flexible thin film capacitors, no peeling nor damage occurred when they were bent several times, and they had equal capacitor properties. However, when these flexible thin film capacitors were bent 50 times, no peeling occurred in the flexible thin film capacitor provided with the protective film, whereas peeling occurred partially in the flexible thin film capacitor without the protective film. Thus, it was confirmed that the protective film treatment further improves durability against mechanical external force.

Furthermore, substantially the same effect was obtained when $SiO_2$, $Ta_2O_5$, $Al_2O_3$, a thermosetting resin, or an ultraviolet-curable resin was used as the protective film, instead of $Si_3N_4$.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A flexible thin film capacitor comprising a substrate formed of at least one selected from the group consisting of an organic polymer and a metal foil, and an inorganic high dielectric film and metal electrode films formed on the substrate, the inorganic high dielectric film being interposed between the metal electrode films,
   wherein the inorganic high dielectric film and at least one of the metal electrode films are formed in contact with an adhesive film on the substrate, thereby being integrated with the substrate by the adhesive film.

2. The flexible thin film capacitor according to claim 1, wherein the adhesive film is a metal oxide adhesive film.

3. The flexible thin film capacitor according to claim 2, further comprising a metal adhesive film formed between the metal oxide adhesive film and the metal electrode films.

4. The flexible thin film capacitor according to claim 3, wherein the metal adhesive film is formed in a region except for a portion between the metal oxide adhesive film and the inorganic high dielectric film.

5. The flexible thin film capacitor according to claim 1, wherein the adhesive film comprises at least one metal selected from the group consisting of Cr, NiCr, Ti, Co, Ge, Cu, Sn, Mo and W.

6. The flexible thin film capacitor according to claim 1, the substrate having a first main surface and a second main surface, wherein the inorganic high dielectric film and the metal electrode films are formed on the first main surface of the substrate, and at least one of the metal electrode films is connected to a metal electrode film on the second main surface of the substrate via a through hole provided in the substrate.

7. The flexible thin film capacitor according to claim 1, the substrate having a first main surface and a second main surface, wherein the inorganic high dielectric film and the metal electrode films are formed on the first main surface of the substrate, and at least one of the metal electrode films is connected to a metal electrode film on the second main surface of the substrate via an end face of the substrate.

8. The flexible thin film capacitor according to claim 1, further comprising a protective film formed on the inorganic high dielectric film and the metal electrode films.

9. The flexible thin film capacitor according to claim 8, wherein the protective film is formed of at least one material selected from the group consisting of $SiO_2$, $Si_3N_4$, $Ta_2O_5$, $Al_2O_3$, a thermosetting resin, and an ultraviolet-curable resin.

10. The flexible thin film capacitor according to claim 1, wherein a thickness of the entire capacitor is not more than 300 $\mu$m.

11. The flexible thin film capacitor according to claim 1, wherein the substrate is an organic polymer substrate, and the organic polymer substrate is formed of at least one material selected from the group consisting of polyimide, polyamide, polyimide-amide, polyester and polysulfone.

12. The flexible thin film capacitor according to claim 1, wherein the substrate is a metal foil substrate, and the metal foil substrate is formed of stainless steel.

13. The flexible thin film capacitor according to claim 1, wherein the metal electrode film is formed of at least one material selected from the group consisting of Pt, Ag, Au, Cu, Ni, Al, Pd, Ru and Ir.

14. The flexible thin film capacitor according to claim 1, wherein the inorganic high dielectric film is formed of at least one material selected from the group consisting of $SrTiO_3$, $BaTiO_3$, $PbTiO_3$, $CaTiO_3$, and solid solutions thereof.

* * * * *